(12) United States Patent
Wang et al.

(10) Patent No.: US 12,302,737 B2
(45) Date of Patent: May 13, 2025

(54) MASK ASSEMBLY, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kui Wang, Beijing (CN); Na Bi, Beijing (CN); Longhui Xue, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 503 days.

(21) Appl. No.: 17/631,118

(22) PCT Filed: Oct. 20, 2020

(86) PCT No.: PCT/CN2020/122179
§ 371 (c)(1),
(2) Date: Jan. 28, 2022

(87) PCT Pub. No.: WO2022/082428
PCT Pub. Date: Apr. 28, 2022

(65) Prior Publication Data
US 2022/0359852 A1   Nov. 10, 2022

(51) Int. Cl.
*H10K 71/00*   (2023.01)
*H10K 50/822*  (2023.01)
*H10K 59/35*   (2023.01)

(52) U.S. Cl.
CPC ........... *H10K 71/00* (2023.02); *H10K 50/822* (2023.02); *H10K 59/35* (2023.02)

(58) Field of Classification Search
CPC ...... H10K 71/00; H10K 50/822; H10K 59/35; H10K 59/80521; C23C 14/042; G03F 1/00
See application file for complete search history.

(56) References Cited

U.S. PATENT DOCUMENTS

2018/0155818 A1   6/2018  Mu et al.
2019/0144987 A1*  5/2019  Guo ................. H10K 71/00
                                                    118/504

(Continued)

FOREIGN PATENT DOCUMENTS

CN   107740040 A    2/2018
CN   108004504 A *  5/2018  ........... B05C 21/005

(Continued)

OTHER PUBLICATIONS

China National Intellectual Property Administration, Notification to grant patent right for invention of Chinese application No. 202080002388.2 issued on Jan. 28, 2025, which is foreign counterpart application of this US application.

*Primary Examiner* — Douglas W Owens
(74) *Attorney, Agent, or Firm* — Lippes Mathias LLP

(57) ABSTRACT

Provided is a mask assembly, including: an annular mask frame; a supporting structure, located on a side of the mask frame, fixedly connected to the mask frame, and having an opening; and a mask structure, located on a side of the mask frame and fixedly connected to the mask frame, and including a strip-shaped mask body and a sheet-shaped mask piece corresponding to the opening, wherein the mask piece is fixedly connected to a side edge of the mask body and has a plurality of first through holes, wherein an orthographic projection of the mask body on a bearing surface of the mask frame does not overlap with an orthographic projection of the opening on the bearing surface, and an orthographic (Continued)

projection of the mask piece on the bearing surface overlaps with the orthographic projection of the opening on the bearing surface.

19 Claims, 12 Drawing Sheets

(56) References Cited

U.S. PATENT DOCUMENTS

| | | | |
|---|---|---|---|
| 2019/0305222 A1* | 10/2019 | Jung | H10K 59/873 |
| 2020/0135837 A1 | 4/2020 | Cui et al. | |
| 2021/0332470 A1* | 10/2021 | Qi | C23C 14/042 |
| 2022/0155831 A1 | 5/2022 | Sun et al. | |

FOREIGN PATENT DOCUMENTS

| | | | |
|---|---|---|---|
| CN | 108365134 A | 8/2018 | |
| CN | 109097729 A | 12/2018 | |
| CN | 109244269 A | 1/2019 | |
| CN | 109321880 A | 2/2019 | |
| CN | 109585696 A | 4/2019 | |
| CN | 109801950 A | 5/2019 | |
| CN | 109957754 A | 7/2019 | |
| CN | 110473988 A | 11/2019 | |
| CN | 110863176 A | 3/2020 | |
| CN | 110923625 A | 3/2020 | |
| CN | 111235525 A | 6/2020 | |
| CN | 210856314 U | 6/2020 | |
| CN | 111430414 A | 7/2020 | |
| CN | 111540774 A | 8/2020 | |
| CN | 111593299 A | 8/2020 | |
| EP | 3736354 A1 * | 11/2020 | B05C 21/005 |

\* cited by examiner

MASK ASSEMBLY, DISPLAY PANEL, AND DISPLAY DEVICE

CROSS-REFERENCE TO RELATED APPLICATION

This application is a 371 of PCT Application No. PCT/CN2020/122179, filed on Oct. 20, 2020, the disclosure of which is incorporated herein by reference in its entirety.

TECHNICAL FIELD

The present disclosure relates to the technical field of display technologies, and in particular, to a mask plate, a display panel, and a display device.

BACKGROUND

Organic light-emitting diode (OLED) display panels have advantages such as self-luminescence, low driving voltage and high response speed, and thus are widely used.

SUMMARY

The present disclosure provides a mask assembly and a method for manufacturing same, a display panel, and a display device.

According to an aspect of the present disclosure, a mask assembly is provided. The mask assembly includes:
an annular mask frame;
a supporting structure, located on a side of the mask frame, fixedly connected to the mask frame, and having an opening; and
a mask structure, located on a side of the mask frame and fixedly connected to the mask frame, and including a strip-shaped mask body and a sheet-shaped mask piece corresponding to the opening, wherein the mask piece is fixedly connected to a side edge of the mask body and has a plurality of first through holes, wherein
an orthographic projection of the mask body on a bearing surface of the mask frame does not overlap with an orthographic projection of the opening on the bearing surface, and an orthographic projection of the mask piece on the bearing surface overlaps with the orthographic projection of the opening on the bearing surface.

In some embodiments, the mask body includes a first connecting portion, a second connecting portion, and a supporting portion located between the first connecting portion and the second connecting portion;
one end of the first connecting portion is fixedly connected to the mask frame, and the other end of the first connecting portion is connected to one end of the supporting portion;
one end of the second connecting portion is fixedly connected to the mask frame, and the other end of the second connecting portion is connected to the another end of the supporting portion, wherein
the mask piece is fixedly connected to a side edge of the supporting portion.

In some embodiments, the mask frame is a rectangular mask frame; a first groove is provided at a first edge of the mask frame, and a second groove is provided at a second edge of the mask frame, the first edge being parallel to the second edge; the supporting structure includes a supporting body, and a third connecting portion and a fourth connecting portion which are connected to the supporting body;
the third connecting portion is fixedly connected to the first edge via the first groove, and the fourth connecting portion is fixedly connected to the second edge via the second groove.

In some embodiments, wherein a third groove is provided at a third edge of the mask frame, and a fourth groove is provided at a fourth edge of the mask frame; the supporting structure further includes a fifth connecting portion and a sixth connecting portion which are connected to the supporting body;
the fifth connecting portion is fixedly connected to the third edge via the third groove, and the sixth connecting portion is fixedly connected to the fourth edge via the fourth groove;
the third edge is parallel to the fourth edge, and perpendicular to the first edge.

In some embodiments, a depth of the first groove, a depth of the second groove, a depth of the third groove, and a depth of the fourth groove are all 0.9 to 1.1 times of a length of the supporting structure along a direction perpendicular to the bearing surface.

In some embodiments, the mask structure is located on a side of the supporting structure distal from the mask body, and fixedly connected to the side of the supporting structure.

In some embodiments, a fifth groove is provided at a first edge of the mask frame, and a sixth groove is provided at a second edge of the mask frame, the first edge being parallel to the second edge;
the mask body is fixedly connected to the first edge via the fifth groove, and fixedly connected to the second edge via the sixth groove.

In some embodiments, a depth of the fifth groove is 0.9 to 1.1 times of a length of the mask body along a direction perpendicular to the bearing surface;
a depth of the sixth groove is 0.9 to 1.1 times of the length of the mask body along the direction perpendicular to the bearing surface.

In some embodiments, the supporting structure has a plurality of the openings, and the plurality of openings are located on at least one side of the mask structure;
the mask structure includes a plurality of the mask pieces arranged at intervals, and the plurality of mask pieces are fixedly connected to the side edge of the mask body.

In some embodiments, the plurality of openings are located on both sides of the mask structure;
a first type of mask pieces in the plurality of mask pieces are located on a first side of the mask body, and fixedly connected to a side edge of the mask body to the first side;
a second type of mask pieces in the plurality of mask pieces are located on a second side of the mask body, and fixedly connected to a side edge of the mask body to the second side;
wherein the first side and the second side are opposite sides of the mask body, and an extending direction of the first side and an extending direction of the second side are both parallel to an extending direction of the mask body.

In some embodiments, the supporting structure is a sheet-shaped structure and the opening is provided in the sheet-shaped structure; or,
the supporting structure includes a plurality of strip-shaped structures enclosing the opening.

In some embodiments, the mask body and the mask piece are of an integral structure.

In some embodiments, a strip-shaped seventh groove is provided in a side surface of the supporting structure distal from the mask frame, and the supporting portion of the mask body is disposed in the seventh groove.

In some embodiments, a depth of the seventh groove is 0.9 to 1.1 times of a length of the supporting portion along a direction perpendicular to the bearing surface.

In some embodiments, a plurality of second through holes are provided in the supporting portion of the mask body.

According to another aspect of the present disclosure, a method for manufacturing a mask assembly is provided. The method includes:

providing an annular mask frame, a supporting structure and a mask structure, wherein an opening is provided in the supporting structure, and the mask structure includes a strip-shaped mask body and a sheet-shaped mask piece corresponding to the opening; the mask piece is fixedly connected to a side edge of the mask body, and a plurality of first through holes are provided in the mask piece;

disposing the supporting structure on a side of the mask frame, and welding the supporting structure to the mask frame; and disposing the mask structure on a side of the mask frame, and welding the mask structure to the mask frame, so that an orthographic projection of the mask body on a bearing surface of the mask frame does not overlap with an orthographic projection of the opening on the bearing surface, and an orthographic projection of the mask piece on the bearing surface overlaps with the orthographic projection of the opening on the bearing surface.

In some embodiments, after disposing the mask structure on the side of the mask frame and welding the mask structure to the mask frame, the method further includes:

welding the mask structure to the supporting structure.

According to still another aspect of the present disclosure, a display panel is provided. The display panel is prepared by using the mask assembly described in the above aspect; the display panel includes:

a base substrate, having a first display region and a second display region located on a side of the first display region;

a first anode layer, a first light-emitting layer and a first cathode layer which are located in the first display region and sequentially stacked along a direction away from the base substrate; and a second anode layer, a second light-emitting layer and a second cathode layer which are located in the second display region and sequentially stacked along a direction away from the base substrate, wherein the second cathode layer includes a plurality of cathode patterns that are disposed at intervals.

In some embodiments, the first anode layer, the first light-emitting layer and the first cathode layer are capable of being divided into a plurality of first sub-pixels, and the second anode layer, the second light-emitting layer and the second cathode layer are capable of being divided into a plurality of second sub-pixels;

an orthographic projection of the cathode patterns on the base substrate covers an orthographic projection of a light-emitting region of one or more of the second sub-pixels on the base substrate.

In some embodiments, the display panel further includes: a first hole transporting layer and a first electron transporting layer which are located in the first display region, and a second hole transporting layer and a second electron transporting layer which are located in the second display region, wherein the second hole transporting layer includes a plurality of hole transporting patterns disposed at intervals, and the second electron transporting layer includes a plurality of electron transporting patterns disposed at intervals.

In some embodiments, a shape of the hole transporting patterns, a shape of the electron transporting patterns, and a shape of the cathode patterns are same;

a size of the hole transporting patterns is same as a size of the electron transporting patterns, and smaller than or equal to a size of the cathode patterns.

According to yet another aspect of the present disclosure, a display device is provided. The display device includes an image sensor and the display panel described in the above aspect.

The image sensor is located on a side of the base substrate distal from the second anode layer, and located in the second display region of the base substrate in the display pane.

BRIEF DESCRIPTION OF THE DRAWINGS

For clearer illustrations of the technical solutions in the embodiments of the present disclosure, the following will briefly introduces accompanying drawings required for describing the embodiments. Obviously, the accompanying drawings in the following description show merely some embodiments of the present disclosure, and those of ordinary skill in the art may still derive other drawings from these accompanying drawings without creative efforts.

DETAILED DESCRIPTION

To make the objectives, technical solutions, and advantages of the present disclosure more clear, embodiments of the present disclosure are described in detail hereinafter in combination with the accompanying drawings.

In the related art, in order to increase the screen-to-body ratio of a display panel, a front camera of a display device may be disposed in a display region of the display panel. The display region of the display panel may include: an anode layer, a light-emitting layer and a cathode layer that are sequentially stacked along a direction away from a base substrate. The camera is disposed on a side of the anode layer distal from the light-emitting layer.

However, the cathode layer may impose an adverse impact on the light transmittance, thereby resulting in a relatively poor imaging effect of the front camera disposed in the display region of the display panel.

Figure 1:
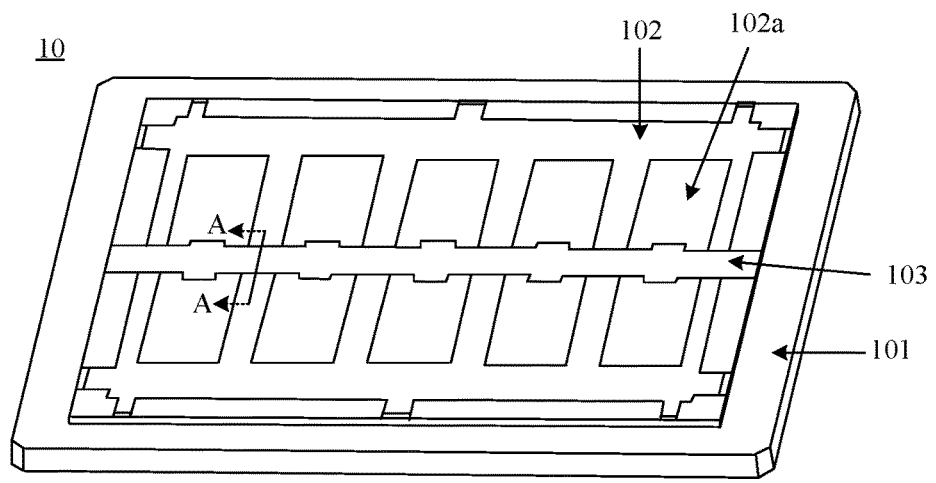
FIG. 1 is a structural schematic diagram of a mask assembly according to an embodiment of the present disclosure.

FIG. 1 is a structural schematic diagram of a mask assembly according to an embodiment of the present disclosure. Referring to FIG. 1, the mask assembly 10 may include an annular mask frame 101, a supporting structure 102, and a mask structure 103.

Figure 2:
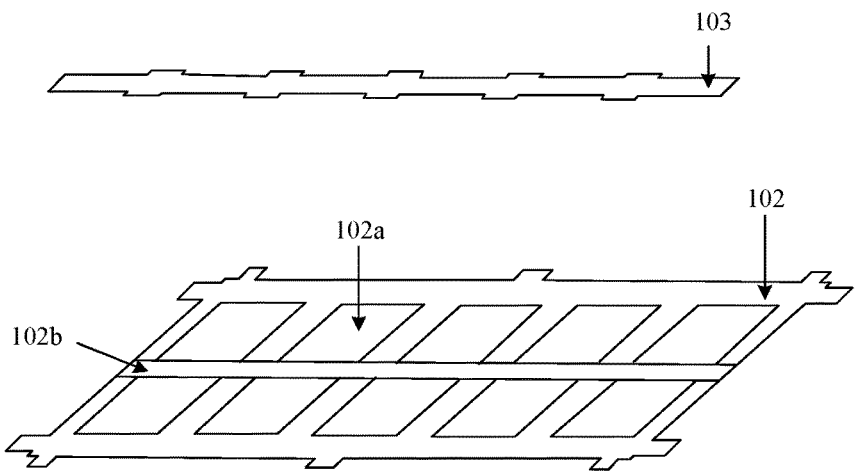
FIG. 2 is an exploded schematic diagram of the mask assembly shown in FIG. 1.
Figure 2:
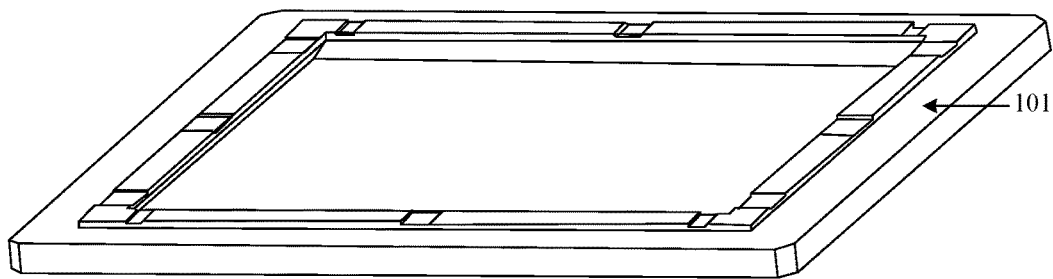

FIG. 2 is an exploded schematic diagram of the mask assembly shown in FIG. 1. Referring to FIG. 2, the supporting structure 102 may be located on a side of the mask frame 101 and fixedly connected to the mask frame 101, and the supporting structure 102 may have one opening 102*a* or more openings 102*a*, wherein the opening 102*a* may be configured to form film layers other than the cathode patterns in the display panel. The mask structure 103 may be located on a side of the mask frame 101 and fixedly connected to the mask frame 101. In FIG. 2, the mask structure 103 is located on a side of the supporting structure 102 distal from the mask frame 101.

Figure 3:
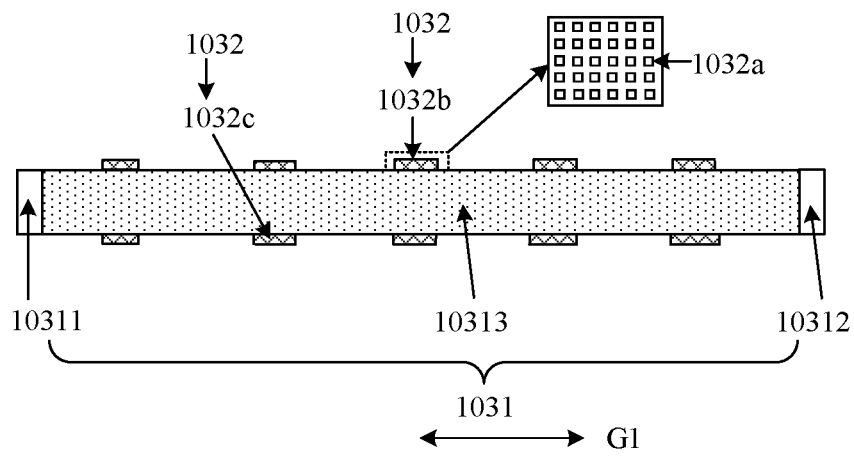
FIG. 3 is a structural schematic diagram of a mask structure according to an embodiment of the present disclosure.

FIG. 3 is a structural schematic diagram of a mask structure according to an embodiment of the present disclosure. The mask structure 103 may include a strip-shaped mask body 1031 and a sheet-shaped mask piece 1032 corresponding to an opening 102*a*. The mask piece 1032 may be fixedly connected to a side edge of the mask body 1031, and a plurality of first through holes 1032*a* may be provided in the mask piece 1032. An orthographic projection of the mask body 1031 on a bearing surface of the mask frame 101 not overlap with an orthographic projection of the opening 102*a* on the bearing surface, so as to prevent the mask body 1031 from affecting the film layers forming the display panel. Furthermore, an orthographic projection of the mask piece 1032 on the bearing surface overlap with an orthographic projection of the opening 102*a* on the bearing surface, so that the plurality of first through holes 1032*a* in the mask piece 1032 can form a plurality of patterns that are separated from one another.

If the mask assembly 10 is used to prepare the cathode layers of respective sub-pixels in the display panel, then each first through hole 1032*a* in the mask piece 1032 may be used to form one cathode pattern of the display panel. As the plurality of first through holes 1032*a* are at intervals, the plurality of cathode patterns prepared by using the mask piece including the plurality of first through holes are also separated from one another. That is, the cathode layer prepared by using the mask assembly does not cover the entire layer, so that the light transmittance is relatively high and the imaging effect of the camera is improved.

Furthermore, as the supporting structure 102 and the mask structure 103 are two separate structures, the opening 102*a* is disposed in the supporting structure 102, and a plurality of first through holes 1032*a* are disposed in the mask structure 103, in this way, both the accuracy in the positioning of the opening 102*a* in the supporting structure 102 when the supporting structure 102 is connected to the mask frame 101, and the accuracy in the positioning of the plurality of first through holes 1032*a* in the mask structure 103 when the mask structure 103 is connected to the mask frame 101, can be ensured. In this way, the difficulty level in manufacturing the mask assembly 10 is reduced, and the yield in using the mask assembly 10 to prepare the display panel is improved.

In summary, the embodiments of the present disclosure provide a mask assembly, the first through holes in the mask structure of the mask assembly may be configured to form the cathode patterns in the display panel, and the opening in the supporting structure may be configured to form film layers other than the cathode patterns in the display panel. As there are gaps between the plurality of cathode patterns formed by the plurality of first through holes, the display panel prepared by using the mask assembly has an increased light transmittance, and the imaging effect of the camera as obtained is improved.

Optionally, the mask body 1031 and the mask piece 1032 in the mask structure 103 may be of an integral structure, which can avoid relative movement between the mask body 1031 and the mask piece 1032, thereby ensuring the quality of the mask structure 103. Furthermore, the mask frame 101, the supporting structure 102 and the mask structure 103 may all be made from an invar alloy material.

In embodiments of the present disclosure, the shape of each of the plurality of first through holes 1032*a* disposed in the mask piece 1032 may be a regular pattern or an irregular pattern. The regular pattern may include a polygon, a circle or an ellipse, or the like, wherein the polygon may include a convex polygon and a concave polygon. The irregular pattern may be a pattern formed by curve line(s) and straight line(s). That is, the shape of the first through holes 1032*a* is not limited in the embodiments of the present disclosure.

Referring to FIG. 3, each of the first through holes 1032*a* may be in a polygon shape, and the polygon may be a rectangle. Optionally, for each of the two edges perpendicular to each other in every first through holes 1032*a*, the length thereof may range from 0.01 mm to 0.3 mm.

Referring to FIG. 3, the mask body 1031 may include a first connection portion 10311, a second connection portion 10312, and a supporting portion 10313 located between the first connection portion 10311 and the second connection portion 10312.

One end of the first connection portion 10311 may be fixedly connected to the mask frame 101, and the other end of the first connection portion 10311 may be connected to one end of the supporting portion 10313. One end of the second connection portion 10312 may be fixedly connected to the mask frame 101, and the other end of the second connection portion 10312 may be connected to another end of the supporting portion 10313. Referring to FIG. 3, the mask piece 1032 may be fixedly connected to a side edge of the supporting portion 10313.

Figure 4:
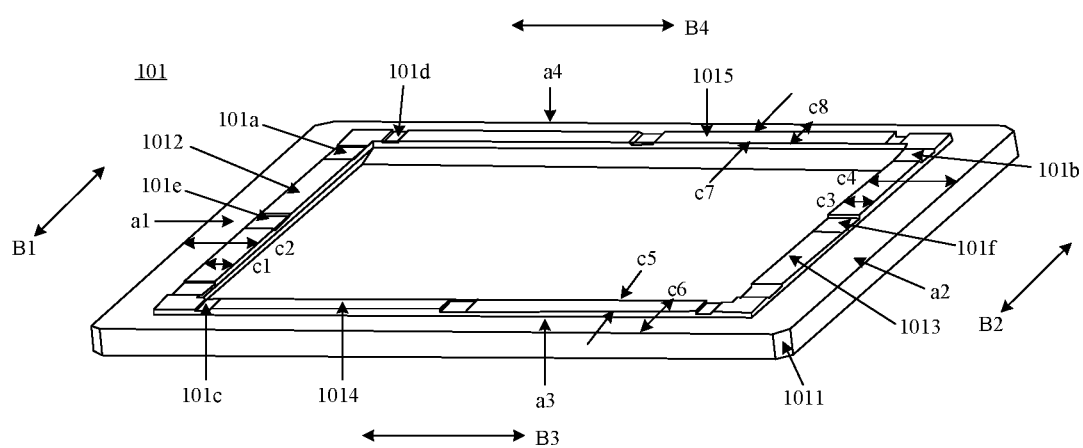
FIG. 4 is a structural schematic diagram of a mask frame according to an embodiment of the present disclosure.

FIG. 4 is a structural schematic diagram of a mask frame according to an embodiment of the present disclosure. Referring to FIG. 4, the mask frame 101 may be a rectangular mask frame 101. A first edge a1 of the mask frame 101 may have a first groove 101a, and a second edge a2 of the mask frame 101 may have a second groove 101b. The first edge a1 is parallel to the second edge a2. Two first grooves 101a and two second grooves 101b are shown in FIG. 4.

Figure 5:
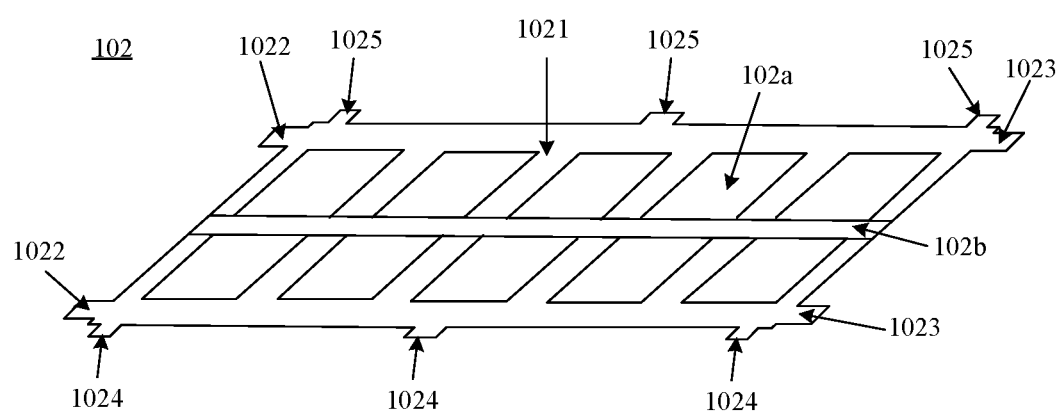
FIG. 5 is a structural schematic diagram of a supporting structure according to an embodiment of the present disclosure.

FIG. 5 is a structural schematic diagram of a supporting structure according to an embodiment of the present disclosure. Referring to FIG. 5, the supporting structure 102 may include a supporting body 1021 and a third connection portion 1022 and a fourth connection portion 1023 which are connected to the supporting body 1021.

In combination with FIG. 1, FIG. 4 and FIG. 5, the third connection portion 1022 may be fixedly connected to the first edge a1 via the first groove 101a, and the fourth connection portion 1023 may be fixedly connected to the second edge a2 via the second groove 101b.

In the embodiments of the present disclosure, referring to FIG. 4, the mask frame 101 may include a frame body 1011, and a first strip-shaped boss 1012 and a second strip-shaped boss 1013 which are fixedly connected to the frame body 1011. The first strip-shaped boss 1012 and the second strip-shaped boss 1013 are oppositely disposed on the frame body 1011 to form the first edge a1 and the second edge a2 of the mask frame 101. The extending direction B1 of the first strip-shaped boss 1012 may be parallel to the extending direction B2 of the second strip-shaped boss 1013.

Referring to FIG. 4, the length c1 of the first strip-shaped boss 1012 perpendicular to the extending direction B1 of the first strip-shaped boss 1012 (that is, the width of the first strip-shaped boss 1012) is smaller than the length c2 of the edge, on which the first strip-shaped boss 1012 is disposed, of the frame body 1011 perpendicular to the extending direction of the first strip-shaped boss 1012. Furthermore, the length c3 of the second strip-shaped boss 1013 perpendicular to the extending direction B2 of the second strip-shaped boss 1013 (that is, the width of the second strip-shaped boss 1013) is smaller than the length c4 of the edge, on which the second strip-shaped boss 1013 is disposed, of the frame body 1011 perpendicular to the extending direction of the second strip-shaped boss 1013.

Referring to FIG. 4, the first groove 101a may be disposed in the first strip-shaped boss 1012, and the second groove 101b may be disposed on the second strip-shaped boss 1013. Moreover, the length of the first groove 101a perpendicular to the extending direction B1 of the first strip-shaped boss 1012 may be equal to the width c1 of the first strip-shaped boss 1012. That is, the length of the first groove 101a perpendicular to the extending direction of the first strip-shaped boss 1012 may be smaller than the length c2 of the edge, on which the first strip-shaped boss 1012 is disposed, of the frame body 1011 perpendicular to the extending direction B1 of the first strip-shaped boss 1012.

The length of the second groove 101b perpendicular to the extending direction B2 of the second strip-shaped boss 1013 may be equal to the width c3 of the second strip-shaped boss 1013. That is, the length of the second groove 101b perpendicular to the extending direction B2 of the second strip-shaped boss 1013 may be smaller than the length c4 of the edge, on which the second strip-shaped boss 1013 is disposed, of the frame body 1011 perpendicular to the extending direction B2 of the second strip-shaped boss 1013.

Referring to FIG. 5, the supporting structure 102 may include two third connection portions 1022 and two fourth connection portions 1023. Correspondingly, the first strip-shaped boss 1012 may have two first grooves 101a corresponding to the two third connection portions 1022 in one-to-one correspondence; and the second strip-shaped boss 1013 may have two second grooves 101b corresponding to the two fourth connection portions 1023 in one-to-one correspondence. Each third connection portion 1022 may be located in a corresponding first groove 101a, and connected to the first groove 101a. Each fourth connection portion 1023 may be located in a corresponding second groove 101b, and connected to the second groove 101b.

In some embodiments, the number of the first grooves 101a may also be greater than the number of the third connection portions 1022, and the number of the second grooves 101b may also be greater than the number of the fourth connection portion 1023, which are not limited in the embodiments of the present disclosure.

In order to ensure the reliability of connection between the supporting structure 102 and the mask frame 101, in addition to being connected to the first edge a1 and the second edge a2 of the mask frame 101, the supporting structure 102 may also be connected to a third edge a3 and a fourth edge a4 of the mask frame 101. The third edge a3 is parallel to the fourth edge a4 and perpendicular to the first edge a1.

Referring to FIG. 5, the supporting structure 102 may further include a fifth connection portion 1024 and a sixth connection portion 1025 which are connected to the supporting body 1021. Referring to FIG. 4, the third edge a3 of the mask frame 101 may have a third groove 101c, and the fourth edge a4 of the mask frame 101 may have a fourth groove 101d. In combination with FIG. 1, FIG. 4 and FIG. 5, the fifth connection portion 1024 may be fixedly connected to the third edge a3 via the third groove 101c, and the sixth connection portion 1025 may be fixedly connected to the fourth edge a4 via the fourth groove 101d.

In the embodiments of the present disclosure, referring to FIG. 4, the mask frame 101 may further include a third strip-shaped boss 1014 and a fourth strip-shaped boss 1015 which are fixedly connected to the frame body 1011. The third strip-shaped boss 1014 and the fourth strip-shaped boss 1015 may be oppositely disposed on the frame body 1011 to form the third edge a3 and the fourth edge a4 of the mask frame 101. The extending direction B3 of the third strip-shaped boss 1014 may be parallel to the extending direction B4 of the fourth strip-shaped boss 1015.

Referring to FIG. 4, the length c5 of the third strip-shaped boss 1014 perpendicular to the extending direction B3 of the third strip-shaped boss 1014 (that is, the width of the third strip-shaped boss 1014) is smaller than the length c6 of the edge, on which the third strip-shaped boss 1014 is disposed, of the frame body 1011 perpendicular to the extending direction B3 of the third strip-shaped boss 1014. Moreover, the length c7 of the fourth strip-shaped boss 1015 perpendicular to the extending direction B4 of the fourth strip-shaped boss 1015 (that is, the width of the fourth strip-shaped boss 1015) is smaller than the length c8 of the edge, on which the fourth strip-shaped boss 1015 is disposed, of the frame body 1011 perpendicular to the extending direction B4 of the fourth strip-shaped boss 1015.

Referring to FIG. 4, the third groove 101c may be disposed in the third strip-shaped boss 1014, and the fourth groove 101d may be disposed in the fourth strip-shaped boss 1015. Moreover, the length of the third groove 101c perpendicular to the extending direction B3 of the third strip-shaped boss 1014 may be equal to the width c5 of the third strip-shaped boss 1014. That is, the length of the third groove 101c perpendicular to the extending direction B3 of the third strip-shaped boss 1014 may be smaller than the length c6 of the edge, on which the third strip-shaped boss 1014 is disposed, of the frame body 1011 perpendicular to the extending direction B3 of the third strip-shaped boss 1014.

The length of the fourth groove 101d perpendicular to the extending direction B4 of the fourth strip-shaped boss 1015 may be equal to the width c7 of the fourth strip-shaped boss 1015. That is, the length of the fourth groove 101d perpendicular to the extending direction B4 of the fourth strip-shaped boss 1015 may be smaller than the length c8 of the edge, on which the fourth strip-shape boss 1015 is disposed, of the frame body 1011 perpendicular to the extending direction B4 of the fourth strip-shaped boss 1015.

Referring to FIG. 5, exemplarily, the supporting structure 102 may include three fifth connection portions 1024 and three sixth connection portions 1025. Correspondingly, the third strip-shaped boss 1014 may have three third grooves 101c corresponding to the three fifth connection portions 1024 in one-to-one correspondence, and the fourth strip-shaped boss 1015 may have fourth grooves 101d corresponding to the three sixth connection portions 1025 in one-to-one correspondence. Each fifth connection portion 1024 may be located in a corresponding third groove 101c, and connected to the third groove 101c. Each sixth connection portion 1025 may be located in a corresponding fourth groove 101d, and connected to the fourth groove 101d.

In some embodiments, the number of the third grooves 101c may also be greater than the number of the fifth connection portion 1024, and the number of the fourth grooves 101d may also be greater than the number of the sixth connection portion 1025, which are not limited in the embodiments of the present disclosure.

In the embodiments of the present disclosure, the depth of the first grooves 101a, the depth of the second grooves 101b, the depth of the third grooves 101c, and the depth of the fourth grooves 101d may all be 0.9 to 1.1 times of the length of the supporting structure 102 along the direction perpendicular to the bearing surface.

Exemplarily, the depth of the first grooves 101a, the depth of the second grooves 101b, the depth of the third grooves 101c, and the depth of the fourth grooves 101d may all be equal to the length of the supporting structure 102 along the direction perpendicular to the bearing surface. Therefore, the surface of the supporting structure 102 distal from the mask frame 101 can be coplanar with a surface of the mask frame 101, so that the mask assembly 10 can have a good flatness.

Optionally, the frame body 1011, the first strip-shaped boss 1012, the second strip-shaped boss 1013, the third strip-shaped boss 1014 and the fourth strip-shaped boss 1015 may be of an integral structure. Exemplarily, referring to FIG. 4, the fourth strip-shaped boss 1015 may be formed as a hollow rectangular boss.

As an optional implementation, the mask structure 103 may be located on a side of the supporting structure 102 distal from the mask frame 101, and fixedly connected to the side of the supporting structure 102. Moreover, as the supporting structure 102 is fixedly connected to the mask frame 101, the mask structure 103 is fixedly connected to the mask frame 101 via the supporting structure 102.

Exemplarily, one end of the first connection portion 10311 on the mask body 1031 of the mask structure 103 may be connected to the supporting structure 102, and an end of the second connection portion 10312 on the mask body 1031 of the mask structure 103 may be connected to the supporting structure 102.

As another optional implementation, referring to FIG. 4, the mask frame 101 may be a rectangular mask frame 101. The first edge a1 of the mask frame 101 may further have a fifth groove 101e, and the second edge a2 of the mask frame 101 may further have a sixth groove 101f. The first edge a1 is parallel to the second edge a2. One fifth groove 101e and one sixth groove 101f are shown in FIG. 4.

In combination with FIG. 1 and FIG. 4, the mask body 1031 may be fixedly connected to the first edge a1 via the fifth groove 101e, and fixedly connected to the second edge a2 via the sixth groove 101f. Exemplarily, the first connection portion 10311 of the mask body 1031 may be located in the fifth groove 101e, and connected to the fifth groove 101e. The second connection portion 10312 may be located in the sixth groove 101f, and connected to the sixth groove 101f.

In the embodiments of the present disclosure, the depth of the fifth groove 101e may be 0.9 to 1.1 times of the length of the mask body 1031 along the direction perpendicular to the bearing surface. The depth of the sixth groove 101f may be 0.9 to 1.1 times of the length of the mask body 1031 along the direction perpendicular to the bearing surface.

Optionally, the depth of the fifth groove 101e and the depth of the sixth groove 101f may be both equal to the length of the mask body 1031 along the direction perpendicular to the bearing surface. In this way, the surface of the mask body 1031 distal from the mask frame 101 can be coplanar with a surface of the mask frame 101, so that the mask assembly 10 can have a good flatness.

Exemplarily, as the fifth groove 101e is connected to the first connection portion 10311 of the mask body 1031, the depth of the fifth groove 101e may be equal to the length of the first connection portion 10311 along the direction perpendicular to the bearing surface. Moreover, as the sixth groove 101f is connected to the second connection portion 10312 of the mask body 1031, the depth of the sixth groove 101f may be equal to the length of the second connection portion 10312 along the direction perpendicular to the bearing surface.

In combination with FIG. 2 and FIG. 5, a strip-shaped seventh groove 102b may be provided in the surface of the supporting structure 102 distal from the mask frame 101, and the supporting portion 10313 of the mask structure 103 may be located in the seventh groove 102b. In this way, the relative movement between the mask structure 103 and the supporting structure 102 can be avoided, and the positional accuracy of the mask structure 103 can be ensured.

Figure 6:
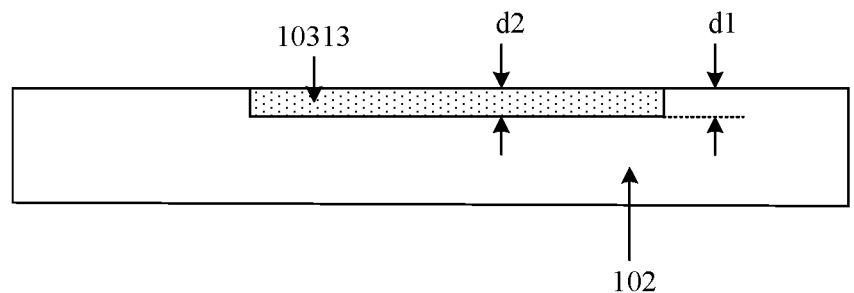
FIG. 6 is a sectional view along a direction AA of the mask assembly shown in FIG. 1.

In the embodiments of the present disclosure, the depth d1 of the seventh groove 102b may be 0.9 to 1.1 times of the length d2 of the supporting portion 10313 along the direction perpendicular to the bearing surface. Exemplarily, as shown in FIG. 6, the depth d1 of the seventh groove 102b is equal to the length d2 of the supporting portion 10313 along the direction perpendicular to the bearing surface. Therefore, the surface of the supporting portion 10313 distal from the mask frame 101 can be coplanar with a surface of the supporting structure 102, so that the mask assembly 10 may have a good flatness.

Optionally, the length of the first connection portion 10311 along the direction perpendicular to the bearing surface, the length of the second connection portion 10312 along the direction perpendicular to the bearing surface, and the length of the supporting portion 10313 along the direction perpendicular to the bearing surface may all be equal.

Therefore, in order to ensure the flatness of the mask assembly 10, the depth of the fifth groove 101e, the depth of the sixth groove 101f, and the depth of the seventh groove 102b may all be equal.

As the depth of the fifth groove 101e and the depth of the sixth groove 101f in the mask frame 101 are both equal to the depth of the seventh groove 102b in the supporting structure 102, and the depth of the seventh groove 102b is less than the length of the supporting structure 102 along the direction perpendicular to the bearing surface of the mask frame 101, the depth of the first groove 101a, the depth of the second groove 101b, the depth of the third groove 101c and the depth of the fourth groove 101d are all greater than the depth of the fifth groove 101e and the depth of the sixth groove 101f.

In the embodiments of the present disclosure, the supporting structure 102 may have a plurality of openings 102a, and the plurality of openings 102a may be located on at least one side of the mask structure 103. The mask structure 103 may include a plurality of mask pieces 1032 arranged at intervals, and the plurality of mask pieces 1032 may be fixedly connected to a side edge of the mask body 1031.

As an optional implementation, referring to FIG. 1, the supporting structure 102 may have a plurality of openings 102a, and the plurality of openings 102a may be disposed on two sides of the mask structure 103.

Referring to FIG. 3, a first type of mask pieces 1032b in the plurality of mask pieces 1032 may be located on a first side of the mask body 1031, and fixedly connected to the side edge of the mask body 1031 to the first side. A second type of mask pieces 1032c in the plurality of mask pieces 1032 may be located on a second side of the mask body 1031, and fixedly connected to the side edge of the mask body 1031 to the second side.

Here, the first side and the second side may be two opposite sides of the mask body 1031, and the extending direction of the first side and the extending direction of the second side may be both parallel to the extending direction G1 of the mask body 1031.

Exemplarily, referring to FIG. 1, the supporting structure 102 may have ten openings 102a, and the ten openings 102a are symmetrically distributed on two sides of a mask structure 103. That is, five openings 102a are provided on each side of the mask structure 103. In combination with FIG. 1 and FIG. 3, the mask structure 103 may include ten mask pieces 1032, and the orthographic projection of each mask piece 1032 on the bearing surface of the mask frame 101 overlaps with the orthographic projection of one opening 102a on the bearing surface.

In the plurality of display panels prepared by using the mask assembly 10 according to the embodiments of the present disclosure, the display panels disposed on two sides of the mask structure 103 have opposite orientations. Moreover, in each display panel, the region for disposing the camera is close to the mask structure 103 side.

Figure 7:
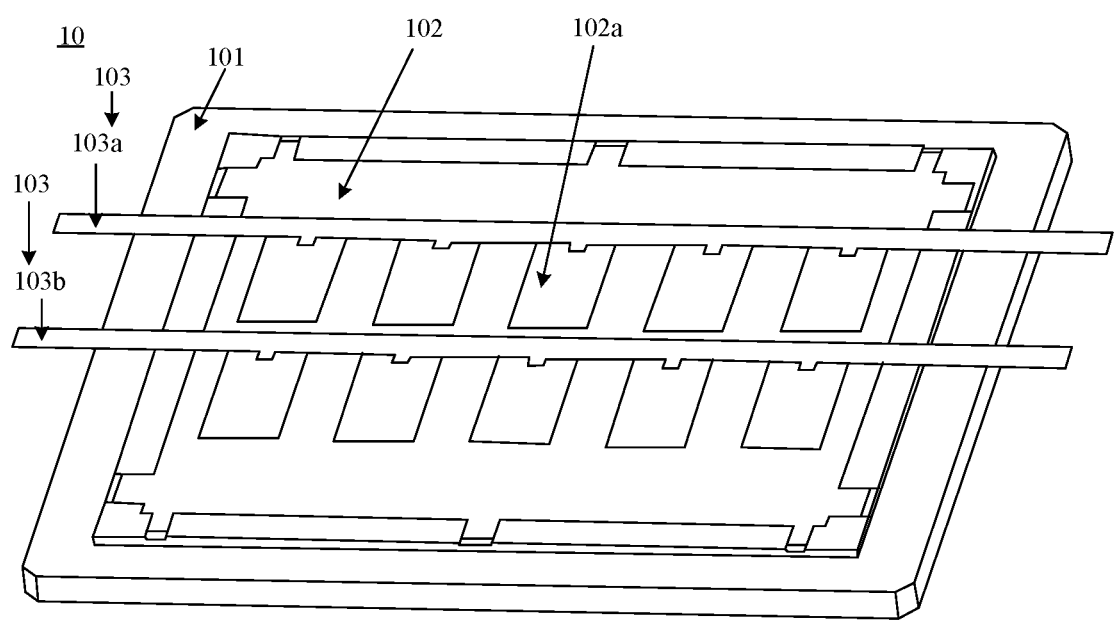
FIG. 7 is a structural schematic diagram of another mask assembly according to an embodiment of the present disclosure.
Figure 8:
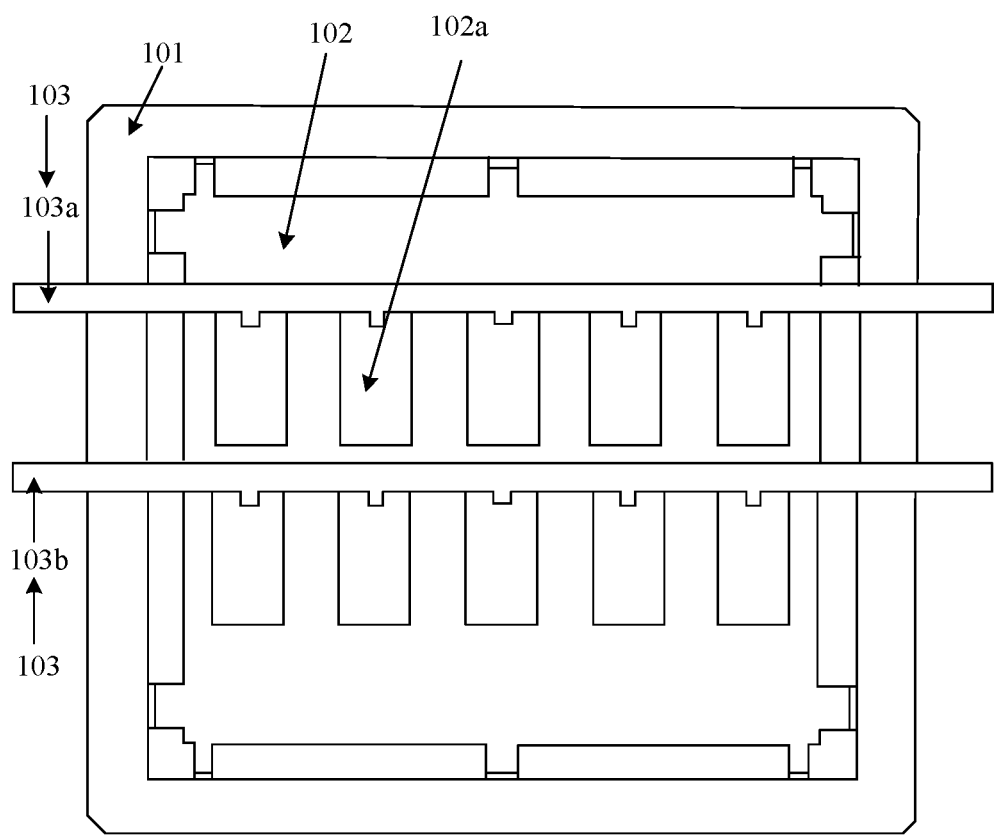
FIG. 8 is a top view of the mask assembly shown in FIG. 7.

As another optional implementation, referring to FIG. 7 and FIG. 8, the supporting structure 102 may have a plurality of openings 102a, and the plurality of openings 102a may be located on one side of the mask structure 103.

Exemplarily, referring to FIG. 7 and FIG. 8, the mask assembly 10 may include two mask structures 103 (a first mask structure 103a and a second mask structure 103b). The supporting structure 102 may have ten openings 102a, wherein five openings in the ten openings 102a are located on a side of the first mask structure 103a, and the other 5 openings in the ten openings 102a are located on a side of the second mask structure 103b.

Figure 9:
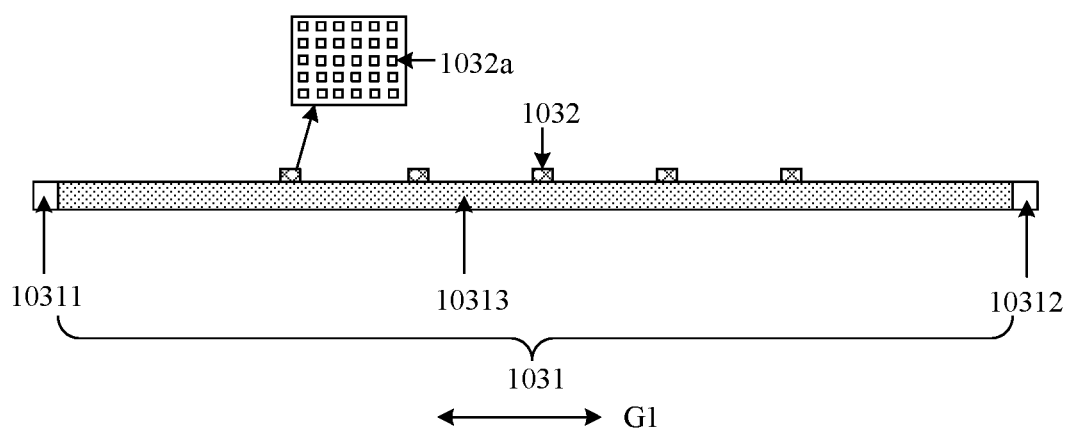
FIG. 9 is a structural schematic diagram of another mask structure according to an embodiment of the present disclosure.

FIG. 9 is a structural schematic diagram of another mask structure according to an embodiment of the present disclosure. Referring to FIG. 9, the mask structure 103 may include a plurality of mask pieces 1032. The plurality of mask pieces 1032 may be arranged at intervals on a side of the mask body 1031, and may be all fixedly connected to a same side edge of the mask body 1031. Here, five mask pieces 1032 are shown in FIG. 9.

In this case, the plurality of display panels prepared by using the mask assembly 10 according to this embodiment of the present disclosure have the same orientation. Moreover, in each display panel, the region for disposing the camera is close to the mask structure 103 side which is used for preparing the display panel.

Figure 10:
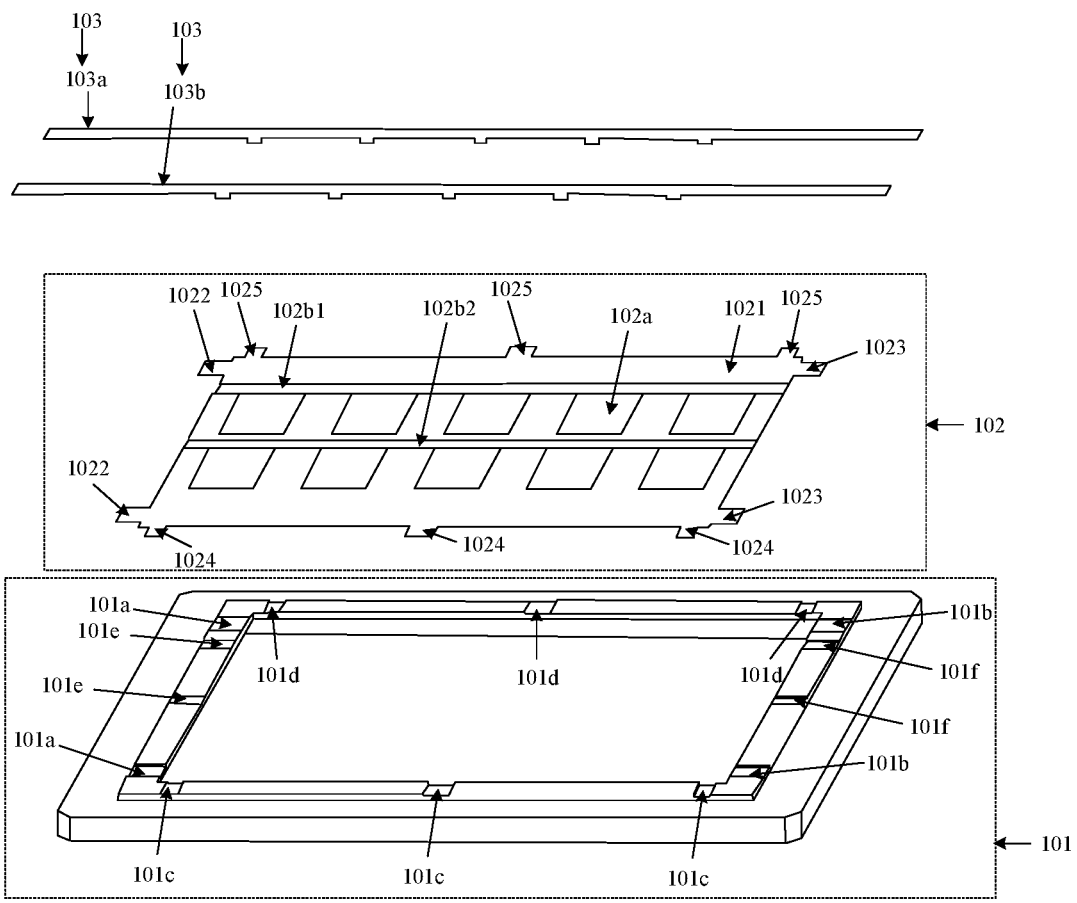
FIG. 10 is an exploded schematic diagram of the mask assembly shown in FIG. 7.

FIG. 10 is an exploded schematic diagram of the mask assembly shown in FIG. 7. Referring to FIG. 10, the mask assembly 10 includes two mask structures 103 (a first mask structure 103a and a second mask structure 103b). Correspondingly, two strip-shaped seventh grooves (102b1 and 102b2) are provided in the supporting structure 102, and the mask frame 101 may have two fifth grooves 101e and two sixth grooves 101f.

The first mask structure 103a may be located in the corresponding seventh groove 102b1, and may be connected to a corresponding fifth groove 101e and a corresponding sixth groove 101f. The second mask structure 103b may be disposed in the corresponding seventh groove 102b2, and may be connected to a corresponding fifth groove 101e and a corresponding sixth groove 101f.

Figure 11:
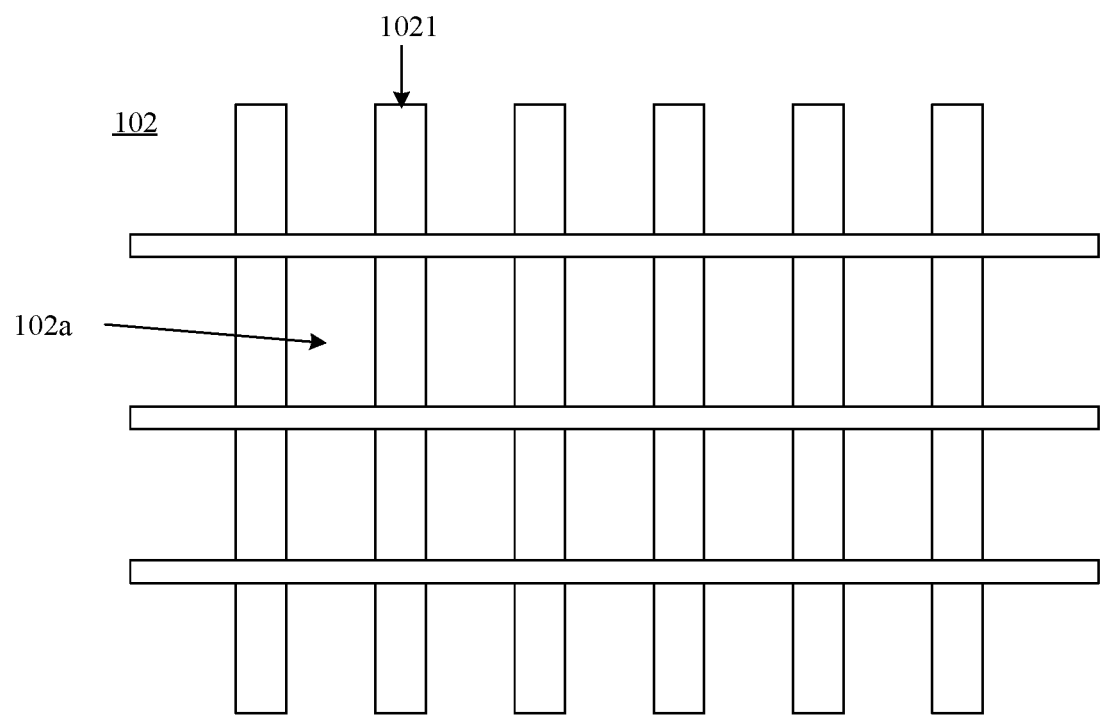
FIG. 11 is a structural schematic diagram of another supporting structure according to an embodiment of the present disclosure.

In the embodiments of the present disclosure, referring to FIG. 5, the supporting structure 102 may be of a sheet-shaped structure having a plurality of openings 102a. Alternatively, referring to FIG. 11, the supporting structure 102 may include a plurality of strip-shaped structures 1021 which together enclose the plurality of openings 102a.

Figure 12:
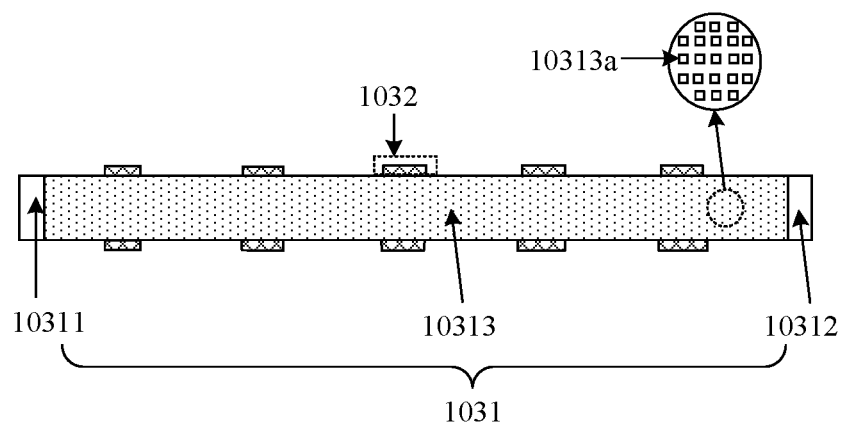
FIG. 12 is a structural schematic diagram of still another mask structure according to an embodiment of the present disclosure.
Figure 13:
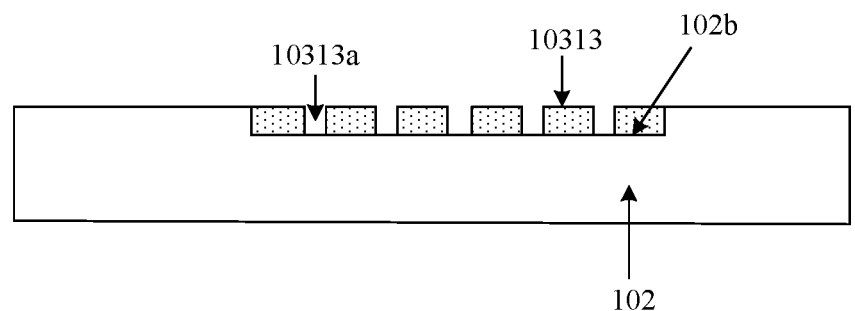
FIG. 13 is a sectional view of a mask structure and a supporting structure according to an embodiment of the present disclosure.

FIG. 12 is a structural schematic diagram of still another mask structure according to an embodiment of the present disclosure. FIG. 13 is a sectional view of a mask structure and a supporting structure according to an embodiment of the present disclosure. In combination with FIG. 12 and FIG. 13, a plurality of second through holes 10313a may be provided in the supporting portion 10313. The plurality of second through holes 10313a can reduce the rigidity of the supporting portion 10313, imparting the supporting portion 10313 with a good tensile performance. Therefore, when the mask structure 103 is connected to the mask frame 101 by a netting manner, by applying a pulling force to the mask body 1031 to adjust the positional relationship between the mask body 1031 and the mask frame 101, the position of the mask piece 1032 on the bearing surface of the frame body 1011 can be adjusted, such that the positional accuracy of the first through holes 1032a in the mask piece 1032 can be ensured.

As the positional accuracy of the first through holes 1032a in the mask piece 1032 is relatively high, the positional accuracy of the film layers in the display panel prepared by using the mask assembly 10 is also relatively high, so that the yield of the display panel is relatively high.

In the embodiments of the present disclosure, each of the second through holes 10313a may alternatively be in a polygon, a circle or an ellipse shape. Referring to FIG. 12, the shape of each second through hole 10313a may also be a polygon, and the polygon may be a rectangle. Optionally, each of two edges, perpendicular to each other, of every second through hole 10313a may have a length ranging from 0.01 mm to 0.3 mm.

Optionally, the shape of the second through holes 10313a and the shape of the first through holes 1032a may be the same. In some embodiments, the shape of the second through holes 10313a and the shape of the first through holes 1032a may be different. Moreover, the size of the second through holes 10313a and the size of the first through holes 1032a may be the same. In some embodiments, the size of the second through holes 10313a and the size of the first through holes 1032a may be different.

In summary, the embodiments of the present disclosure provide a mask assembly. In the mask assembly, the first through holes in the mask structure may be configured to form the cathode patterns in the display panel, and the opening in the supporting structure may be configured to form film layers other than the cathode patterns in the display panel. As there are gaps between the plurality of cathode patterns formed by the plurality of first through holes, the display panel prepared by using the mask assembly has an increased light transmittance, and the imaging effect of the camera as obtained is improved.

Figure 14:
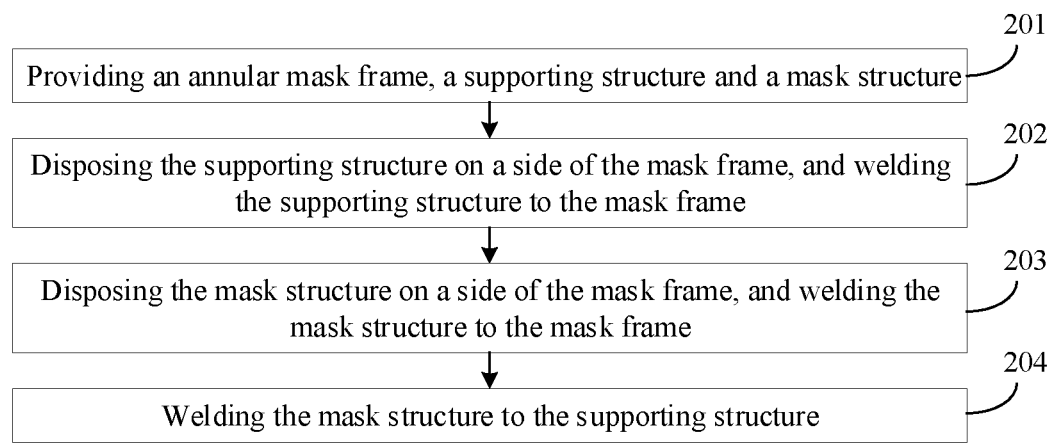
FIG. 14 is a flowchart of a method for manufacturing a mask assembly according to an embodiment of the present disclosure.

FIG. 14 is a flowchart of a method for manufacturing a mask assembly according to an embodiment of the present disclosure. Referring to FIG. 14, the method may include the following steps.

In 201, an annular mask frame, a supporting structure and a mask structure are provided.

In the embodiments of the present disclosure, the supporting structure 102 may have an opening 102a. The opening 102a may be configured to form a film layer in a display panel. The mask structure 103 may include a strip-shaped mask body 1031 and a sheet-shaped mask piece 1032 corresponding to the opening 102a. The mask piece 1032 may be fixedly connected to a side edge of the mask body 1031, and may have a plurality of first through holes 1032a.

In this case, each first through hole 1032a may be configured to form one cathode pattern of the display panel. As the plurality of first through holes 1032a are at intervals, there are also gaps among the plurality of cathode patterns in the prepared display panel. As such, light can pass through the gaps among the plurality of cathode patterns, the light transmittance is increased, and the imaging effect of the camera is improved.

Optionally, the mask body 1031 and the mask piece 1032 may be of an integral structure.

In 202, the supporting structure is disposed on a side of the mask frame, and is welded to the mask frame.

In the embodiments of the present disclosure, the supporting structure 102 may be first disposed on a side of the mask frame 101, and then stretched to a suitable position by a netting stretcher, and welded to the mask frame 101, thereby ensuring the positional accuracy of the opening 102a in the supporting structure 102.

In 203, the mask structure is disposed on a side of the mask frame, and welded to the mask frame.

In the embodiments of the present disclosure, the mask structure 103 may be first disposed on a side of the mask frame 101, for example, the mask structure 103 may be disposed on the side of the supporting structure 102 distal from the mask frame 101. Then, the mask structure 103 may be stretched to a suitable position by a netting stretcher. Moreover, in order to avoid the position offset of the first through holes 1032a in the mask structure 103, a certain pulling force may be applied to the mask structure 103, and then, the mask structure 103 may be welded to the mask frame 101.

In 204, the mask structure is welded to the supporting structure.

In the embodiments of the present disclosure, in order to further avoid the position offset of the first through holes 1032a in the mask structure 103, the supporting portion 10313 of the mask body 1031 in the mask structure 103 may also be welded to the supporting structure 102.

In the embodiments of the present disclosure, after the mask structure 103 is welded to the mask frame 101 and the supporting structure 102, the mask structure 103 may also be cut to prevent the boundary of the mask structure 103 from exceeding beyond the boundary of the mask frame 101. Moreover, after the mask structure 103 is welded to the mask frame 101 and the supporting structure 102, whether the position and the size of the first through holes 1032a in the mask structure 102 satisfy use requirements may be detected. When it is determined that the requirements are satisfied, the mask assembly 10 as manufactured may be put in use to prepare the display panel.

In summary, the embodiments of the present disclosure provide a method for manufacturing a mask assembly. In the mask assembly manufactured by using the method, the first through holes in the mask structure may be configured to form the cathode patterns in the display panel, and the opening in the supporting structure may be configured to form film layers other than the cathode patterns in the display panel. As there are gaps among the plurality of cathode patterns formed by the plurality of first through holes, the display panel prepared by using the mask assembly has an increased light transmittance, and the imaging effect of the camera as obtained is improved.

Figure 15:
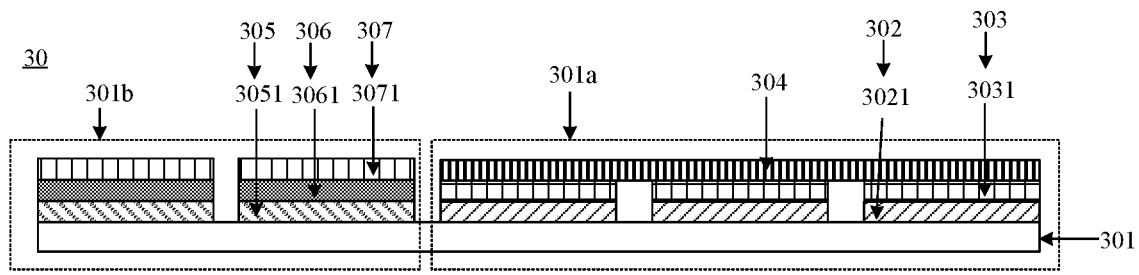
FIG. 15 is a structural schematic diagram of a display panel according to an embodiment of the present disclosure.

FIG. 15 is a structural schematic diagram of a display panel according to an embodiment of the present disclosure. The display panel may be prepared by the mask assembly 10 provided in the above embodiments. Referring to FIG. 15, the display panel 30 may include a base substrate 301, a first anode layer 302, a first light-emitting layer 303, a first cathode layer 304, a second anode layer 305, a second light-emitting layer 306 and a second cathode layer 307.

Figure 16:
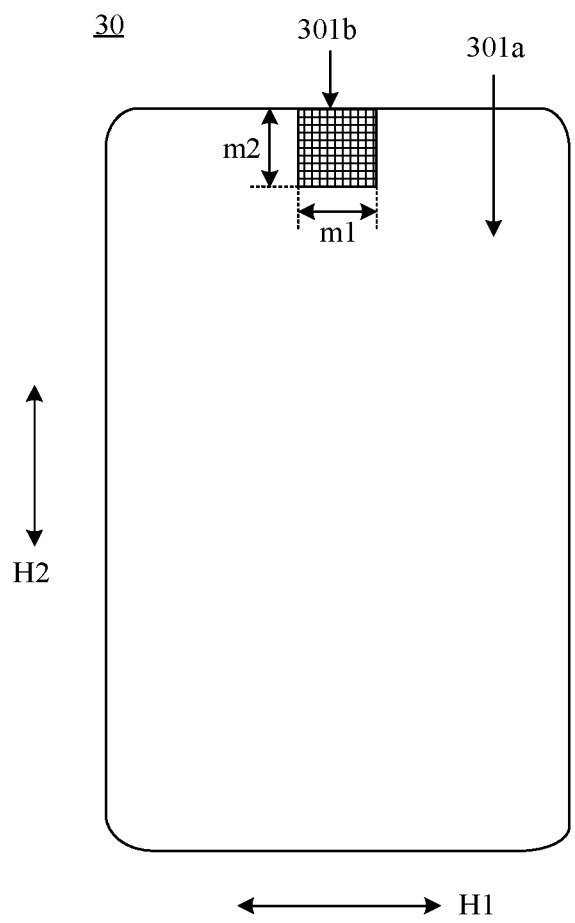
FIG. 16 is a top view of the display panel shown in FIG. 15.

FIG. 16 is a top view of the display panel shown in FIG. 15. In combination with FIG. 15 and FIG. 16, the base substrate 301 may have a first display region 301a and a second display region 301b located on a side of the first display region 301a. The first anode layer 302, the first light-emitting layer 303 and the first cathode layer 304 may be disposed in the first display region 301a, and sequentially stacked along a direction away from the base substrate 301. The second anode layer 305, the second light-emitting layer 306 and the second cathode layer 307 may be located in the second display region 301b, and sequentially stacked along the direction away from the base substrate 301.

Referring to FIG. 15, the first cathode layer 304 may be of a plate-shaped structure, and the second cathode layer 307 may include a plurality of cathode patterns 3071 disposed at intervals. The first cathode layer 304 and the second cathode layer 307 may be prepared by using the mask assembly 10 provided in the above embodiment of the present disclosure. The opening 102a in the supporting structure 102 of the mask assembly 10 may be configured to form the first cathode layer 304, and each of the plurality of first through holes 1032a in the mask structure 103 of the mask assembly 10 may be configured to form one cathode pattern 3071.

In summary, the embodiments of the present disclosure provide a display panel. In the display panel, the second cathode layer included may be disposed in a second display region of the base substrate. As the plurality of cathode patterns included in the second cathode layer are disposed at intervals, compared with the cathode layer which covers the entire second display region, the impact on the light transmittance can be effectively reduced, thereby improving the imaging effect of the camera disposed in the second display region.

In the embodiments of the present disclosure, the first anode layer 302, the first light-emitting layer 303 and the first cathode layer 304 can be used to form a plurality of first sub-pixels. The second anode layer 305, the second light-emitting layer 306 and the second cathode layer 307 can be used to form a plurality of second sub-pixels.

Referring to FIG. 15, the first anode layer 302 may further include a plurality of first anode patterns 3021. The first light-emitting layer 303 may include a plurality of first light-emitting patterns 3031. The plurality of first anode patterns 3021 are corresponding to the plurality of first light-emitting patterns 3031 in one-to-one correspondence. Each first anode pattern 3021, together with a corresponding first light-emitting pattern 3031 and the first cathode layer 304, may form a first sub-pixel.

Moreover, the second anode layer 305 may further include a plurality of second anode patterns 3051. The second light-emitting layer 306 may include a plurality of second light-emitting patterns 3061. Moreover, the plurality of second anode patterns 3051, the plurality of second light-emitting patterns 3061, and a plurality of cathode patterns 3071 may be in one-to-one correspondence. Each second anode pattern 3051, together with a corresponding second light-emitting pattern 3061 and a corresponding cathode pattern 3071, may form a second sub-pixel.

In the embodiments of the present disclosure, for each cathode pattern 3071, the orthographic projection thereof on the base substrate 301 may cover the orthographic projection of the light-emitting region of at least one second sub-pixel on the base substrate 301. Here, the light-emitting region of the second sub-pixel may refer to an overlapping region of the orthographic projection of the second anode pattern 3051 of the second sub-pixel on the base substrate 301 and the orthographic projection of the second light-emitting pattern 3061 on the base substrate 301.

Figure 17:
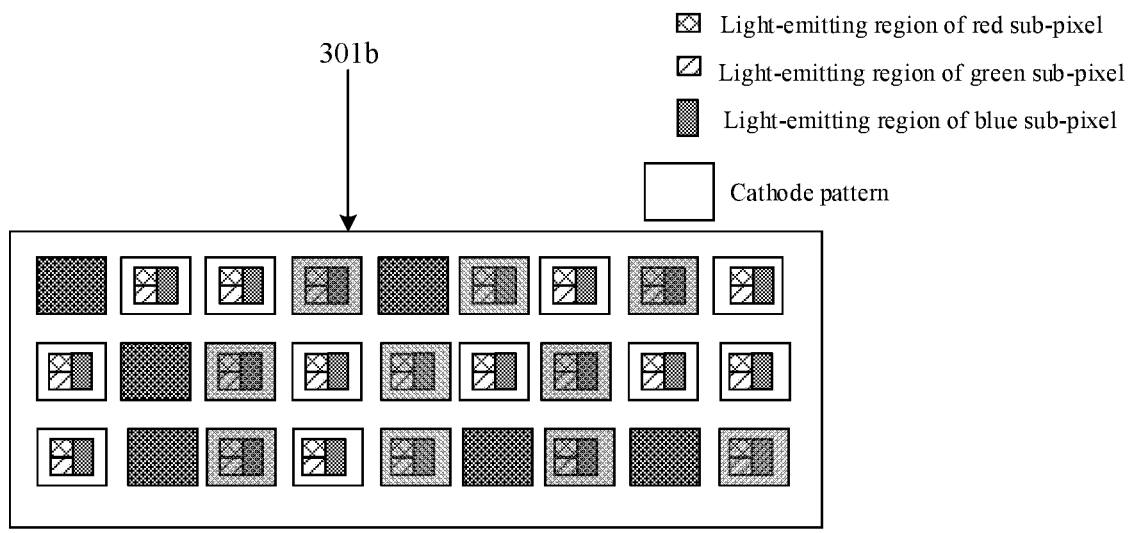
FIG. 17 is a structural schematic diagram of cathode patterns according to an embodiment of the present disclosure.

Exemplarily, as shown in FIG. 17, the orthographic projection of each cathode pattern 3071 on the base substrate 301 may cover orthographic projections of light-emitting regions of three second sub-pixels on the base substrate 301. Here, the three second sub-pixels may include a red (R) sub-pixel, a green (G) sub-pixel and a blue (B) sub-pixel.

Figure 18:
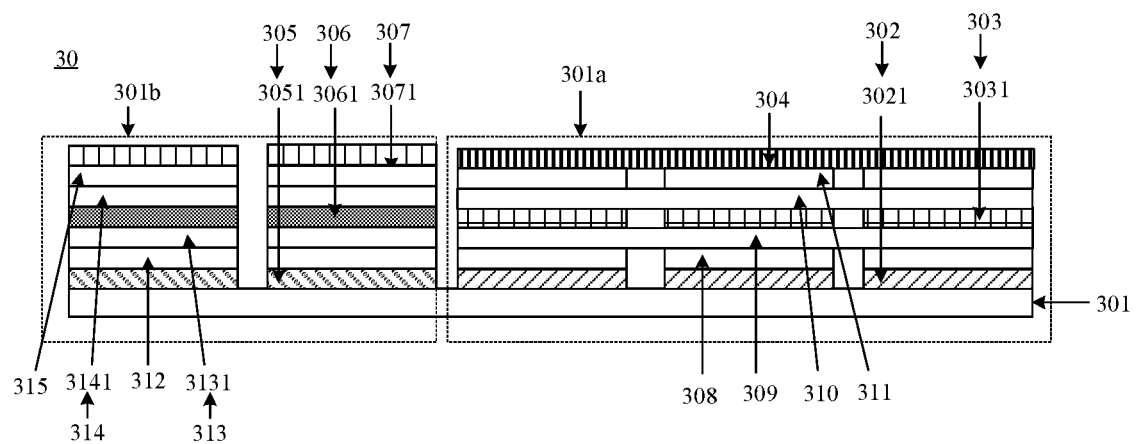
FIG. 18 is a structural schematic diagram of another display panel according to an embodiment of the present disclosure.

FIG. 18 is a structural schematic diagram of another display panel according to an embodiment of the present disclosure. Referring to FIG. 18, the display panel 30 may further include a first hole injection layer 308, a first hole transporting layer 309, a first electron transporting layer 310 and a first electron injection layer 311 which are located in the first display region 301a, and a second hole injection layer 312, a second hole transporting layer 313, a second electron transporting layer 314 and a second electron injection layer 315 which are located in the second display region 301b.

The first anode layer 302, the first hole injection layer 308, the first hole transporting layer 309, the first light-emitting layer 303, the first electron transporting layer 310, the first electron injection layer 311 and the first cathode layer 304 are sequentially stacked along a direction away from the base substrate 301. The second anode layer 305, the second hole injection layer 312, the second hole transporting layer 313, the second light-emitting layer 306, the second electron transporting layer 314, the second electron injection layer 315 and the second cathode layer 307 are sequentially stacked along the direction away from the base substrate 301.

Optionally, the first anode layer 302, the first light-emitting layer 303, the second anode layer 305, the second light-emitting layer 306, the first hole injection layer 308, the first electron injection layer 311, the second hole injection layer 312 and the second electron injection layer 315 may all be made by a fine metal mask (FMM).

The first hole transporting layer 309, the first electron transporting layer 310, the second hole transporting layer 313 and the second electron transporting layer 314 may be prepared by using an open mask plate. That is, the first hole transporting layer 309, the first electron transporting layer 310, the second hole transporting layer 313, and the second electron transporting layer 314 may all be of a plate-shaped structure.

Alternatively, the first hole transporting layer 309, the first electron transporting layer 310, the second hole transporting layer 313, and the second electron transporting layer 314 may be prepared by using the mask assembly 10 provided in the above embodiments of the present disclosure. The first hole transporting layer 309 and the first electron transporting layer 310 may both be of a plate-shaped structure. The second hole transporting layer 313 may include a plurality of hole transporting patterns 3131 disposed at intervals. The second electron transporting layer 314 may include a plurality of electron transporting patterns 3141 disposed at intervals.

The first hole transporting layer 309 and the first electron transporting layer 310 may be formed by the opening 102a of the supporting structure 102 in the mask assembly 10, and each of the first through holes 1032a in the mask structure 103 of the mask assembly 10 may be configured to form one hole transporting pattern 3131 or one electron transporting pattern 3141.

Optionally, the first through holes in the mask assembly 10 for forming the hole transporting patterns 3131 in the display panel 30, and the first through holes in the mask assembly 10 for forming the electron transporting patterns 3141, may be the same in shape and size.

Moreover, the shape of the first through holes in the mask assembly 10 for forming the hole transporting patterns 3131 in the display panel 30 may be the same as the shape of the first through holes in the mask assembly 10 for forming the cathode patterns 3071 in the display panel 30. The size of the first through holes in the mask assembly 10 for forming the hole transporting patterns 3131 in the display panel 30 is smaller than the size of the first through holes in the mask assembly 10 for forming the cathode patterns 3071 in the display panel 30.

That is, the shape of the hole transporting patterns 3131, the shape of the electron transporting patterns 3141 and the shape of the cathode patterns may be the same. Moreover, the size of the hole transporting patterns 3131 may be the same as the size of the electron transporting patterns 3141, and the size of the hole transporting patterns 3131 is smaller than the size of the cathode patterns 3071. Therefore, there can be non-overlapping region among the cathode patterns 3071, the hole transporting patterns 3131 and the electron transporting patterns 3141, so that the cathode patterns 3071 may be connected to a cathode signal line located on a side of the hole transporting patterns 3131 proximal to the base substrate 301 through a through hole, so as to help the cathode signal line to provide cathode signals for the cathode patterns 3071.

In some embodiments, the shape of the hole transporting patterns 3131 and the shape of the electron transporting patterns 3141 may be different from that of the cathode patterns 3071, which is not limited in the embodiments of the present disclosure.

Optionally, the hole transporting patterns 3131 and the electron transporting patterns 3141 may be the same in shape and size, in this case, the hole transporting patterns 3131 and the electron transporting patterns 3141 may be prepared by using a same mask assembly 10, or prepared by using two different mask assemblies 10.

In the embodiments of the present disclosure, the shape of the second display region 301b may be a rectangle, and in the two edges of the rectangle perpendicular to each other, one may have a length ranging from 2 mm to 10 mm, and the other one may have a length ranging from 2 mm to 15 mm.

Exemplarily, the length m1 of the second display region 301b along the pixel row direction H1 may be 3.21 mm, that is, m1=3.21 mm. The length m2 of the second display region 301b along the pixel column direction H2 may be 3.04 mm, that is, m2=3.04 mm.

Figure 19:
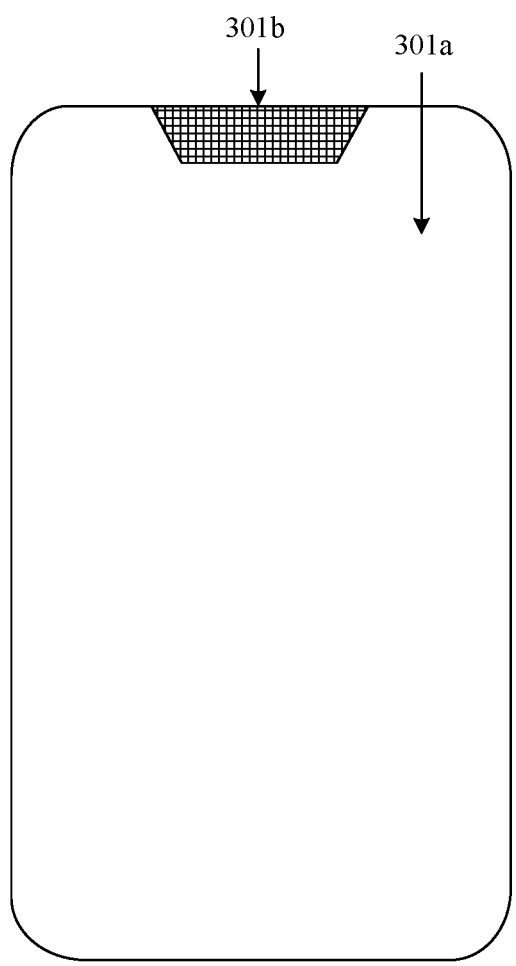
FIG. 19 is a top view of another display panel according to an embodiment of the present disclosure.

In some embodiments, the second display region 301b may also be in other shapes. For example, referring to FIG. 19, the shape of the second display region 301b may be a trapezoid. The shape of the second display region 301b is not limited in the embodiments of the present disclosure.

In summary, the embodiments of the present disclosure provide a display panel. In the display panel, the second cathode layer included may be disposed in a second display region of the base substrate. As the plurality of cathode patterns included in the second cathode layer are disposed at intervals, compared with the cathode layer which covers the entire second display region, the impact on the light transmittance can be effectively reduced, thereby improving the imaging effect of the camera disposed in the second display region.

Figure 20:
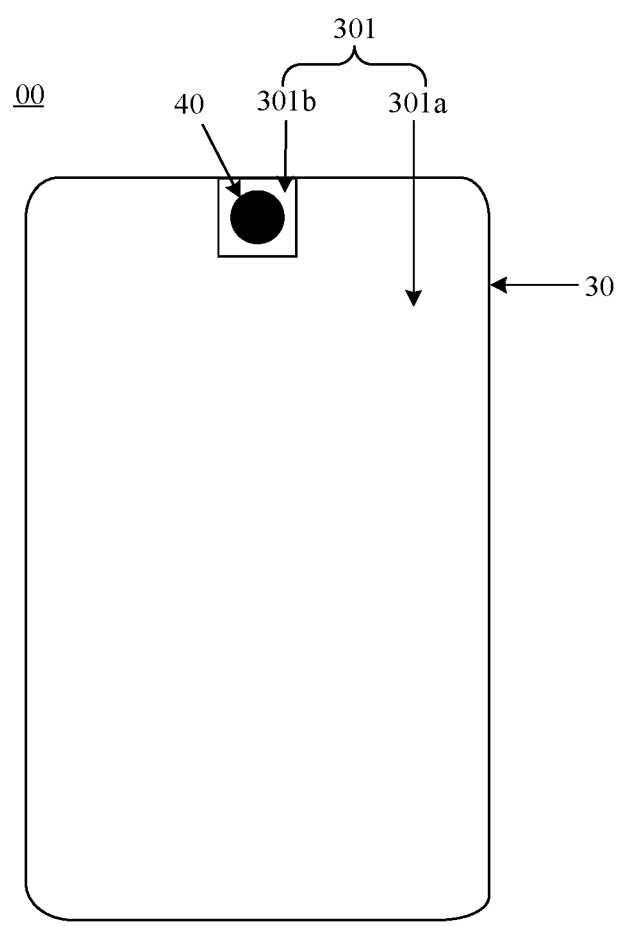
FIG. 20 is a structural schematic diagram of a display device according to an embodiment of the present disclosure.

FIG. 20 is a structural schematic diagram of a display device according to an embodiment of the present disclosure. Referring to FIG. 20, the display device 00 may include an image sensor 40 and a display panel 30 provided in the above embodiments. The image sensor 40 may be located on a side of a base substrate 301 in the display panel 30 distal from the second anode layer 305, and located in the second display region 301b of the base substrate 301. The image sensor 40 may be a front camera of the display device 00 for photographing an image.

Optionally, the display device may be any product or component having a display function such as an OLED display device, a liquid crystal display device, electronic paper, a mobile phone, a tablet computer, a television, a monitor, a laptop, a digital photo frame or a navigator.

Described above are merely optional embodiments of the present disclosure, and are not intended to limit the present disclosure. Within the spirit and principles of the present disclosure, any modifications, equivalent substitutions, improvements, and the like are all within the protection scope of the present disclosure.

What is claimed is:

1. A mask assembly, comprising:
an annular mask frame;
a supporting structure, located on a side of the mask frame, fixedly connected to the mask frame, and having an opening; and
a mask structure, located on a side of the mask frame and fixedly connected to the mask frame, and comprising a strip-shaped mask body and a sheet-shaped mask piece corresponding to the opening, wherein the mask piece is fixedly connected to a side edge of the mask body and has a plurality of first through holes, wherein
an orthographic projection of the mask body on a bearing surface of the mask frame does not overlap with an orthographic projection of the opening on the bearing surface, and an orthographic projection of the mask piece on the bearing surface overlaps with the orthographic projection of the opening on the bearing surface,
wherein the mask frame is a rectangular mask frame; a first groove is provided at a first edge of the mask frame, and a second groove is provided at a second edge of the mask frame, the first edge being parallel to the second edge; the supporting structure comprises a supporting body, and a third connecting portion and a fourth connecting portion which are connected to the supporting body;
the third connecting portion is fixedly connected to the first edge via the first groove, and the fourth connecting portion is fixedly connected to the second edge via the second groove.

2. The mask assembly according to claim 1, wherein the mask body comprises a first connecting portion, a second connecting portion, and a supporting portion located between the first connecting portion and the second connecting portion;
one end of the first connecting portion is fixedly connected to the mask frame, and the other end of the first connecting portion is connected to one end of the supporting portion;
one end of the second connecting portion is fixedly connected to the mask frame, and the other end of the second connecting portion is connected to the another end of the supporting portion, wherein
the mask piece is fixedly connected to a side edge of the supporting portion.

3. The mask assembly according to claim 1, wherein a third groove is provided at a third edge of the mask frame, and a fourth groove is provided at a fourth edge of the mask frame; the supporting structure further comprises a fifth connecting portion and a sixth connecting portion which are connected to the supporting body;
the fifth connecting portion is fixedly connected to the third edge via the third groove, and the sixth connecting portion is fixedly connected to the fourth edge via the fourth groove;
the third edge is parallel to the fourth edge, and perpendicular to the first edge.

4. The mask assembly according to claim 3, wherein a depth of the first groove, a depth of the second groove, a depth of the third groove, and a depth of the fourth groove are all 0.9 to 1.1 times of a length of the supporting structure along a direction perpendicular to the bearing surface.

5. The mask assembly according to claim 1, wherein the mask structure is located on a side of the supporting structure distal from the mask body, and fixedly connected to the side of the supporting structure.

6. The mask assembly according to claim 4, wherein a fifth groove is provided at a first edge of the mask frame, and a sixth groove is provided at a second edge of the mask frame, the first edge being parallel to the second edge;
the mask body is fixedly connected to the first edge via the fifth groove, and fixedly connected to the second edge via the sixth groove.

7. The mask assembly according to claim 6, wherein a depth of the fifth groove is 0.9 to 1.1 times of a length of the mask body along a direction perpendicular to the bearing surface;
a depth of the sixth groove is 0.9 to 1.1 times of the length of the mask body along the direction perpendicular to the bearing surface.

8. The mask assembly according to claim 1, wherein the supporting structure has a plurality of the openings, and the plurality of openings are located on at least one side of the mask structure;
the mask structure comprises a plurality of the mask pieces arranged at intervals, and the plurality of mask pieces are fixedly connected to the side edge of the mask body.

9. The mask assembly according to claim 8, wherein the plurality of openings are located on both sides of the mask structure;
a first type of mask pieces in the plurality of mask pieces are located on a first side of the mask body, and fixedly connected to a side edge of the mask body to the first side;
a second type of mask pieces in the plurality of mask pieces are located on a second side of the mask body, and fixedly connected to a side edge of the mask body to the second side;
wherein the first side and the second side are opposite sides of the mask body, and an extending direction of the first side and an extending direction of the second side are both parallel to an extending direction of the mask body.

10. The mask assembly according to claim 1, wherein the supporting structure is a sheet-shaped structure and the opening is provided in the sheet-shaped structure; or,
the supporting structure comprises a plurality of strip-shaped structures enclosing the opening.

11. The mask assembly according to claim 1, wherein the mask body and the mask piece are of an integral structure.

12. The mask assembly according to claim 6, wherein a strip-shaped seventh groove is provided in a side surface of the supporting structure distal from the mask frame, and the supporting portion of the mask body is disposed in the seventh groove.

13. The mask assembly according to claim 12, wherein a depth of the seventh groove is 0.9 to 1.1 times of a length of the supporting portion along a direction perpendicular to the bearing surface.

14. The mask assembly according to claim 1, wherein a plurality of second through holes are provided in the supporting portion of the mask body.

15. A display panel prepared by using the mask assembly according to claim 1, the display panel comprising:
a base substrate, having a first display region and a second display region located on a side of the first display region;
a first anode layer, a first light-emitting layer and a first cathode layer which are located in the first display region and sequentially stacked along a direction away from the base substrate; and
a second anode layer, a second light-emitting layer and a second cathode layer which are located in the second display region and sequentially stacked along a direction away from the base substrate, wherein
the second cathode layer comprises a plurality of cathode patterns that are disposed at intervals.

16. The display panel according to claim 15, wherein the first anode layer, the first light-emitting layer and the first cathode layer are capable of being divided into a plurality of first sub-pixels, and the second anode layer, the second light-emitting layer and the second cathode layer are capable of being divided into a plurality of second sub-pixels;
an orthographic projection of the cathode patterns on the base substrate covers an orthographic projection of a light-emitting region of one or more of the second sub-pixels on the base substrate.

17. The display panel according to claim 15, further comprising: a first hole transporting layer and a first electron transporting layer which are located in the first display region, and a second hole transporting layer and a second electron transporting layer which are located in the second display region, wherein
the second hole transporting layer comprises a plurality of hole transporting patterns disposed at intervals, and the second electron transporting layer comprises a plurality of electron transporting patterns disposed at intervals.

18. The display panel according to claim 17, wherein a shape of the hole transporting patterns, a shape of the electron transporting patterns, and a shape of the cathode patterns are same;
a size of the hole transporting patterns is same as a size of the electron transporting patterns, and smaller than or equal to a size of the cathode patterns.

19. A display device, comprising an image sensor and the display panel according to claim 15, wherein
the image sensor is located on a side of the base substrate distal from the second anode layer, and located in the second display region of the base substrate in the display panel.

* * * * *